United States Patent
Xie

(10) Patent No.: US 10,911,012 B2
(45) Date of Patent: Feb. 2, 2021

(54) SOUND CONTROL DEVICE FOR CONTROLLING LOAD BASED ON CONTINUOUS SOUND CONTROL SIGNAL

(71) Applicant: Huarong Xie, Guangdong (CN)

(72) Inventor: Huarong Xie, Guangdong (CN)

( * ) Notice: Subject to any disclaimer, the term of this patent is extended or adjusted under 35 U.S.C. 154(b) by 0 days.

(21) Appl. No.: 16/716,469

(22) Filed: Dec. 16, 2019

(65) Prior Publication Data

US 2020/0228083 A1    Jul. 16, 2020

(30) Foreign Application Priority Data

Jan. 14, 2019    (CN) .................... 2019 2 0061363 U

(51) Int. Cl.
| | | |
|---|---|---|
| *H03G 5/00* | (2006.01) | |
| *F02M 35/12* | (2006.01) | |
| *H05B 47/155* | (2020.01) | |
| *H05B 47/12* | (2020.01) | |
| *A63J 17/00* | (2006.01) | |

(52) U.S. Cl.
CPC ........ *H03G 5/005* (2013.01); *F02M 35/1294* (2013.01)

(58) Field of Classification Search
None
See application file for complete search history.

(56) References Cited

U.S. PATENT DOCUMENTS

| | | | | |
|---|---|---|---|---|
| 6,175,632 | B1* | 1/2001 | Marx ................... | H04R 29/008 381/56 |
| 8,405,728 | B2* | 3/2013 | Schmidt ................ | H04N 17/04 348/189 |
| 2001/0030579 | A1* | 10/2001 | Koyama ............... | H03F 3/3094 330/262 |
| 2003/0031330 | A1* | 2/2003 | Kim ....................... | H04R 1/028 381/111 |
| 2004/0218768 | A1* | 11/2004 | Zhurin ..................... | H03G 3/32 381/107 |
| 2006/0197673 | A1* | 9/2006 | Atris ........................ | G08B 1/08 340/815.46 |
| 2009/0129604 | A1* | 5/2009 | Enamito .................. | H04S 7/302 381/58 |

* cited by examiner

*Primary Examiner* — Qin Zhu

(57) ABSTRACT

The present disclosure discloses a sound control device for controlling load based on continuous sound control signal, which comprises a sound control component, a sound control processing component, a CPU processing device, an execution port component and a load, wherein the sound control component is connected to the sound control processing component; the sound control component collects a sound control signal and transmits the sound control signal to the sound control processing component; the sound control processing component is connected to the CPU processing device; and the CPU processing device is respectively connected with the execution port component and the load.

7 Claims, 3 Drawing Sheets

US 10,911,012 B2

SOUND CONTROL DEVICE FOR CONTROLLING LOAD BASED ON CONTINUOUS SOUND CONTROL SIGNAL

CROSS REFERENCE TO RELATED APPLICATIONS

The present application claims the benefit of Chinese Patent Application No. 201920061363.4 filed on Jan. 14, 2019, the contents of which are incorporated herein by reference in their entirety.

TECHNICAL FIELD

The disclosure relates to the field of sound control electronic technology, and in particular to a sound control device for controlling load based on continuous sound control signal.

BACKGROUND

At present, there are many types of sound-controlled electronic lighting device on the market, which are composed of an audio amplifier, a frequency selective circuit, a delay-on circuit and a thyristor circuit. Some sound-controlled electronic lighting devices are controlled by temperature, and the switches of the electronic devices are regulated by temperature. In addition, the switches of some other sound control devices are controlled by sound, but the sound is only a simple sound signal, that is, the sound control device is only able to recognize the simple sound signal and control the opening and closing of the electronic device according to the recognized sound signal. The sound-controlled electronic device on the market is only able to recognize the simple sound signal, and is not able to identify the required sound signal in the noisy sound signal and respond correspondingly to the recognized sound signal.

SUMMARY

In order to solve the above problem, the present disclosure provides a sound control device for controlling load based on continuous sound control signal, which enables a long-term sound control of the load.

In order to achieve the above object, the present disclosure provides a sound control device for controlling load based on continuous sound control signal, comprising a sound control component, a sound control processing component, a CPU processing device, an execution port component and a load, wherein the sound control component is connected to the sound control processing component, the sound control component collects a sound control signal and transmits the sound control signal to the sound control processing component; the sound control processing component is connected to the CPU processing device; and the CPU processing device is respectively connected with the execution port component and the load.

Preferably, the sound control processing component comprises an amplifier and a low pass filter.

Preferably, the sound control processing component classifies the sound control signal into a high-frequency signal and a low-frequency signal and attenuates the high-frequency signal.

Preferably, the sound control processing component transmits the low-frequency signal to the CPU processing device in the form of an analog signal or high and low level signals.

Preferably, the CPU processing device transmits the low-frequency signal to the load according to the intensity of the sound after processing the received low-frequency signal according to the instruction of the execution port component.

Preferably, the sound control signal comprises at least one of a voice signal, a music signal and a vibration signal.

Preferably, the load comprises at least one of an LED lamp, a light bulb, a light string and a motor.

Preferably, the amplifier comprises a transistor, the low pass filter comprises a capacitor and a resistor; the capacitor is a non-polar capacitor, the capacitor is connected in parallel with the resistor; a first end of the capacitor and the base of the transistor are connected in parallel, and a second end of the capacitor is connected in parallel with the collector of the transistor.

Preferably, the sound control component comprises a power supply portion, wherein the power supply portion comprises at least one of an alternating current, a direct current, a high voltage and a low voltage.

Compared with the prior art, the present disclosure has the following beneficial effects: capable of realizing long-term sound control of the load. It is very convenient to control the load only by sound or vibration effect, and it is especially sensitive to intermediate-frequency sound signal and insensitive to low-frequency signal. The electronic component is not limited, as long as it is a component that is able to convert the sound signal into an electrical signal, it is configured as the sound control component; the amplifier circuit is not limited to number of stages, a simple I1 level or a complex multi-level (I2 . . . ) may be adopted, and a large number of stages proves that the sensitivity is high and the amplification effect is better, the designer applies the amplifier circuit according to actual needs; the power supply portion is not limited, comprising alternating current, direct current, high voltage and low voltage, as long as the circuit is able to supply power reasonably, therefore the present disclosure also has the advantage of a wide range of applications. Moreover, the sound control device automatically adapts to the intensity of the collected sound signal, and detects the rhythm in the sound signal no matter how large or small the intensity of the sound signal is. Taking the sound control lamp as an example, the sound control lamp provided by the present disclosure can not only judge the intensity of the collected sound signal or the presence or absence of the sound, but also control the lighting effect by the music rhythm. Specifically, by comparing the intensity of the sound signal collected in a period of time, the rhythm in the sound signal is detected, and the light color is controlled to change as the rhythm changes.

BRIEF DESCRIPTION OF THE DRAWINGS

The drawings in the embodiments of the present disclosure will be described below. The drawings are intended for a further understanding of the present disclosure and explaining the present disclosure together with the specification, and are not intended to limit the protection scope of the present disclosure.

Figure 1:
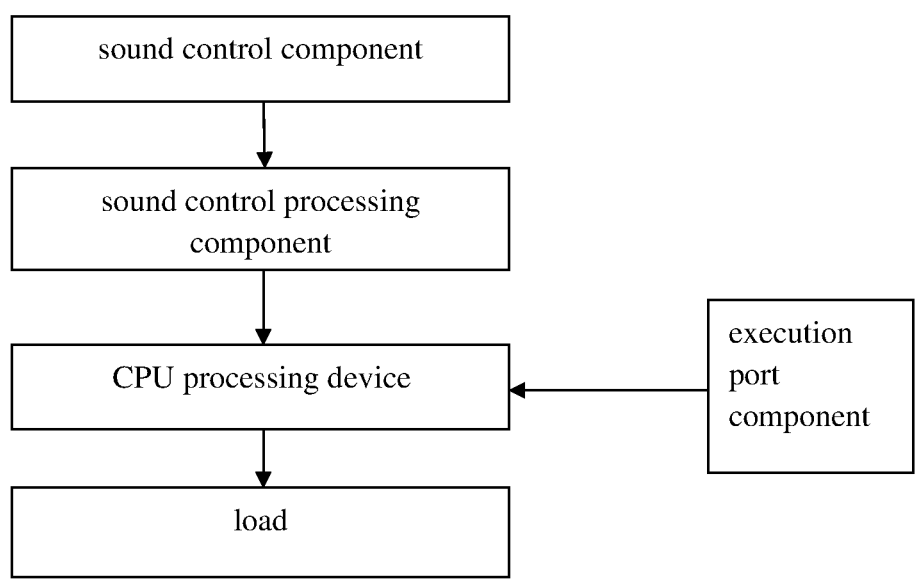
FIG. 1 is a schematic structural view of the sound control device of the present disclosure.

The various reference numerals in the figures are as follows:

11—external execution port, 12—line, 13—line, 14—amplifier circuit, 15—line, 16—sound control component, 18—CPU processing control center, 19—line, 20—output load drive circuit, 21—line, 22—load.

DESCRIPTION OF THE EMBODIMENTS

To make the objective, features, and advantages of the present disclosure clearer and more comprehensible, the following clearly and completely describes the technical solutions in the embodiments of the present disclosure with reference to the accompanying drawings. It should be noted that the embodiments in the present disclosure and the various modes in the embodiments may be combined with each other without conflict. It is understood that the specific embodiments described herein are merely illustrative of the disclosure and are not intended to limit the disclosure.

Devices for implementing various embodiments of the present disclosure will be described below with reference to the accompanying drawings. In the following description, the suffixes such as "module," "component," or "unit" used to denote an element are merely illustrative of the present disclosure, and do not have a specific meaning. Therefore, "module" and "component" can be used in combination.

The disclosure provides a sound control device for controlling load based on continuous sound control signal, which receives a continuous or intermittent sound signal in real time, and continuously or intermittently controls the load according to the received sound signal.

As shown in FIG. 1, in one embodiment, the sound control device comprises a sound control component, a sound control processing component, a CPU processing device, an execution port component and a load. Preferably, the sound control component is connected to the sound control processing component; the sound control component collects one or more sound control signals in real time and transmits the sound control signal to the sound control processing component; the sound control processing component is connected to the CPU processing device; and the CPU processing device is respectively connected with the execution port component and the load. Alternatively, the sound control component is configured to collect voice, sound and vibration. Further, the sound control processing component is configured to amplify and filter the voice, sound and vibration received from the sound control component.

The sound control processing component comprises one or more amplifiers and one or more low pass filters. The amplifier in the sound control processing component amplifies the voice, sound and vibration received from the sound control component, and determines the multi-level amplification of the received sound according to the degree of sensitivity. The sound control processing component classifies the sound control signal into a high-frequency signal and a low-frequency signal; the sound control processing component attenuates the high-frequency signal, that is, the attenuated high-frequency signal is ignored and is not further received and processed. Preferably, the sound control processing component gates the low-frequency signal and transmits the low-frequency signal to the CPU processing device in the form of an analog signal or level (high and low level signals). Therefore, it is sensitive to intermediate-frequency sound signal and insensitive to low-frequency signal. And the sound control processing component ignores the high-frequency signal and focuses on analyzing and processing the intermediate-frequency signal and the low-frequency signal. Preferably, the sound control processing component transmits the low-frequency signal to the CPU processing device in a low level form.

Preferably, the CPU processing device transmits the received low-frequency signal or high-frequency signal to the load according to the instruction of the execution port component.

The technical solution of the disclosure is to convert the acoustic energy signal into an electric energy signal in one or more periods of time, and drive the relevant circuit by processing the electric energy signal, thereby outputting the electric energy signal corresponding to the continuous acoustic energy signal.

This embodiment comprises a sound control device, a signal processing device and a load. The sound control device is connected to the signal processing device, and the signal processing device is connected to the load.

The sound control device is configured to continuously acquire one or more continuous or intermittent acoustic energy signals. The sound control device may be a microphone, or may be placed in a mobile phone, a PAD, a computer and any electronic device. For example, the sound control device may collect one or more pieces of music according to a specified time period, and may also collect sound signal, voice signal and vibration.

The sound control device outputs the collected sound energy signal to the signal processing device in real time. The signal processing device comprises at least a multi-stage amplifier and a low pass filter device. The signal processing device classifies the received signals, and for the low-frequency signals, conducts and outputs the low-frequency signals to the CPU control center in a low level manner; for the high-frequency signals, it is attenuated. The CPU control center may be a CPU in a computer, a device in a mobile phone, or a processing unit in any device or smart device. The CPU control center outputs the processed low level to the load by receiving the control state sent by the execution port, thereby controlling the conduction of the load, the operation speed of the load and the brightness of the load.

The sound control device automatically adapts to the intensity of the collected sound signal, and detects the rhythm in the sound signal no matter how large or small the intensity of the sound signal is. Taking the sound control lamp as an example, the sound control lamp provided by the present disclosure can not only judge the intensity of the collected sound signal or the presence or absence of the sound, but also control the lighting effect by the music rhythm. Specifically, by comparing the intensity of the sound signal collected in a period of time, the rhythm in the sound signal is detected, and the light color is controlled to change as the rhythm changes.

Figure 2:
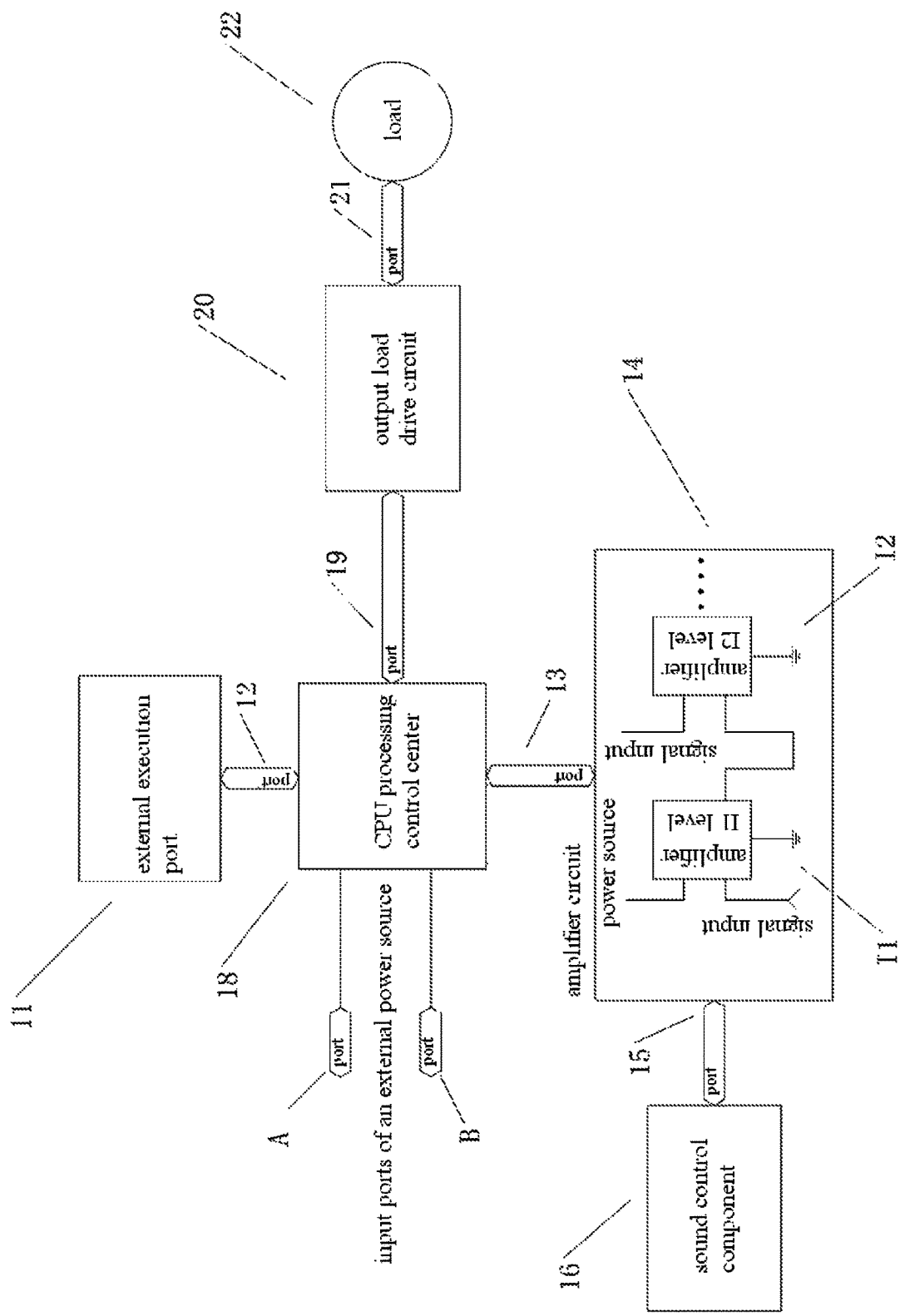
FIG. 2 is a schematic view showing the hardware structure of the sound control device of the present disclosure.

As shown in FIG. 2, in another embodiment, port A and port B are respectively input ports of an external power source, wherein the external power source may be a power supply product, a USB power source, a sound source power supply product, a wind power supply product and all products that generate electricity.

The product of FIG. 2 consists of port A, port B, CPU processing control center 18, sound control component 16, amplifier circuit 14, external execution port 11, output load drive circuit 20 and load 22.

As shown in FIG. 2, the sound control component 16 continuously collects the sound control signal in real time, processes the acquired sound control signal in real time and transmits the processed signal to the amplifier circuit 14 via the line 15. In the amplifier circuit 14, the processed signal is amplified by a multi-stage amplifier. The amplifier circuit is not limited to the number of stages, may be a simple I1 level or a complex multi-level, and the multi-level sensitivity is high, and the amplification effect is better. The amplifier circuit amplifies the processed signal in multiple stages and performs low-pass filtering to identify the high-frequency signal and low-frequency signal in the sound control signal, and outputs the signal to the CPU control center 18 in a high-low level manner, or outputs the signal to the CPU control center 18 in an analog signal mode. The external execution port 11 is configured to output the control state, and the control state is transmitted to the output load drive circuit via the line 19 to drive the load. The load comprises at least one of a motor, a string of lights, an LED, a bulb and is not limited thereto.

Figure 3:
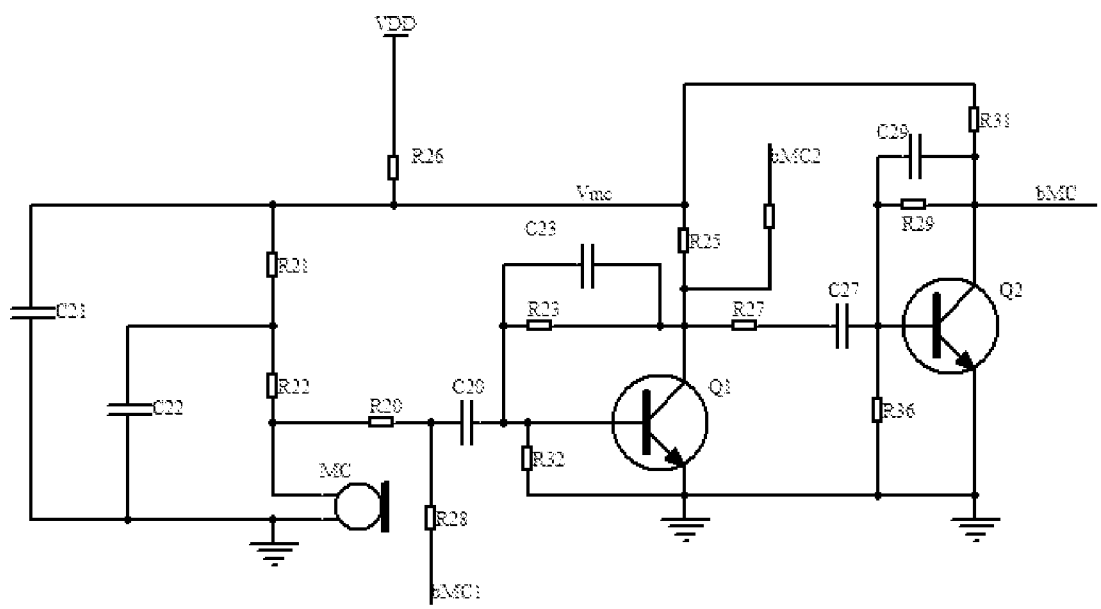
FIG. 3 is a circuit structure diagram of the sound control processing component of the sound control device of the present disclosure.

As shown in FIG. 3, the amplifier circuit comprises: capacitor C20, capacitor C21, capacitor C22, capacitor C23, capacitor C27, capacitor C29, resistor R20, resistor R21, resistor R22, resistor R23, resistor R25, resistor R26, resistor R27, resistor R29, resistor R31, resistor R32, resistor R36, NPN transistor Q1 and NPN transistor Q2.

In particular, the first end of the capacitor C21, the first end of the capacitor C22 and the first output end of the sound control component MC are connected to the ground; the second end of the capacitor C21, the first end of the resistor R21 and the first end of the resistor R25 are connected to the first end of the resistor R31 and the first end of the resistor R26; the second end of the resistor R26 is connected to the power supply VDD; the second end of the capacitor C22 and the first end of the resistor R22 are connected to the second end of the resistor R21; the second end of the resistor R22 and the first end of the resistor R20 are connected to the second output end of the sound control component MC; the second end of the resistor R20 is connected to the first end of the capacitor C20; the second end of the capacitor C20, the first end of the capacitor C23 and the first end of the resistor R23 are connected to the first end of the resistor R32 and the base of the NPN transistor Q1; the second end of the capacitor C23, the second end of the resistor R23 and the second resistor R25 are connected to the first end of the resistor R27 and the collector of the NPN transistor Q1; the second end of the resistor R27 is connected to the first end of the capacitor C27; the second end of the capacitor C27, the first end of the capacitor C29 and the first end of the resistor R29 are connected to the first end of the resistor R36 and the base of the NPN transistor Q2; the second end of the resistor R31 and the second end of the capacitor C29 are connected to the second end of the R29 and the collector of the NPN transistor Q2; and the emitter of the NPN transistor Q1, the emitter of the NPN transistor Q2 and the second end of the resistor R36 are connected to the ground.

According to the present application, R26, R21, R22, C21 and C22 in the above circuit supply power to the sound control component MC and the sound control processing component; the sound control component MC collects the sound signal, and the sound signal is sent to Q1 for amplification through R20 and C20, and R23 and C23 form a low pass filter; the signal amplified by Q1 enters Q2 through R27 and C27 for secondary amplification, and R29 and C29 also form a low pass filter to further select the signal; finally, the output amplified signal MC is sent to the CPU processing device for signal processing, to achieve the effect of controlling the LED strips according to signal changes.

In one embodiment, the load may be set as a light string, and the connection manner thereof is not limited. The sound control component may be a microphone, and the microphone collects the sound signal, and the sound signal is amplified by an amplifier (sent to Q1 via R20/C20), and passes through a low pass filter (R23/C23) to pass the signal with the frequency below 1 kHz, and attenuates the signal with the frequency above 1 kHz and no longer processes it. Therefore, the signal is further gated; for signals with the frequency below 1 kHz, the brightness of the LED strip is controlled according to the signal, for signals with the frequency above 1 kHz, the signal is attenuated and then the brightness of the LED strip is controlled according to the attenuated signal. The embodiment shows that the LED strip is more sensitive to intermediate-frequency sound signal and insensitive to low-frequency signal. That is, when the intermediate-frequency signal is input, the LED strip is brighter, and when the low-frequency signal is input, the LED light bar is darker. For example, when the sound control signal is a piece of music, the brightness of the LED strip will change correspondingly with the rhythm of the music; another example: when the sound control signal is a piece of voice, the conduction of the load is also controlled by the sound control signal.

It should be noted that the term "comprises", "comprising" or any other variations thereof, is intended to cover a non-exclusive inclusion, such that a process, method, article or device including a series of elements not only comprises those elements, but also comprises other elements that are not explicitly listed, or elements that are inherent to such a process, method, article or device. Without further restrictions, an element that is defined by the phrase "comprising a . . . " does not exclude the presence of additional equivalent elements in the process, method, item or device that comprises the element.

The serial numbers of the embodiments of the present disclosure are merely for the description, and do not represent the advantages and disadvantages of the embodiments.

Through the description of the above embodiments, those skilled in the art should clearly understand that the foregoing embodiments are implemented by means of software and a necessary general hardware platform, or through hardware alone, but in many cases the former is a better implementation. Based on this understanding, the technical solution of the present disclosure, which is essential or contributes to the prior art, may be embodied in the form of a software product stored in a storage medium (such as ROM/RAM, disk and CD), comprising a number of instructions for making a terminal device (such as cell phone, PAD, computer, server, air conditioner or network device, etc.) to perform the methods described in each embodiment of the present disclosure.

The above is only a preferred embodiment of the present disclosure, and is not intended to limit the protection scope of the present disclosure. Any equivalent structure or equivalent process transformation obtained by using the specification and accompanying drawings of the present disclosure, or any direct or indirect use of the specification and accompanying drawings of the present disclosure in other related technical fields, is similarly included in the protection scope of the present disclosure.

What is claimed is:

1. A sound control device for controlling load based on continuous sound control signal, comprising a sound control component, a sound control processing component, a CPU processing device, an execution port component and a load, wherein the sound control component is connected to the sound control processing component;

the sound control component collects a sound control signal and transmits the sound control signal to the sound control processing component;

the sound control processing component is connected to the CPU processing device; and the CPU processing device is respectively connected with the execution port component and the load;

the sound control processing component comprises an amplifier and a low pass filter;

the sound control processing component classifies the sound control signal into a high-frequency signal and a low-frequency signal and attenuates the high-frequency signal;

the amplifier comprises a transistor, the low pass filter comprises a capacitor and a resistor;

the capacitor is a non-polar capacitor, the capacitor is connected in parallel with the resistor; a first end of the capacitor and the base of the transistor are connected in parallel, and a second end of the capacitor is connected in parallel with the collector of the transistor.

2. The sound control device of claim 1, wherein the sound control processing component transmits the low-frequency signal to the CPU processing device in the form of an analog signal or high and low level signals.

3. The sound control device of claim 2, wherein the CPU processing device transmits the low-frequency signal to the load according to the intensity of the sound after processing the received low-frequency signal according to the instruction of the execution port component.

4. The sound control device of claim 1, wherein the sound control signal comprises at least one of a voice signal, a music signal and a vibration signal.

5. The sound control device of claim 1, wherein the load comprises at least one of an LED lamp, a light bulb, a light string and a motor.

6. The sound control device of claim 1, wherein the sound control component comprises a power supply portion, wherein the power supply portion comprises at least one of an alternating current, a direct current, a high voltage and a low voltage.

7. The sound control device of claim 1, wherein the sound control processing component comprises: capacitor C20, capacitor C21, capacitor C22, capacitor C23, capacitor C27, capacitor C29, resistor R20, resistor R21, resistor R22, resistor R23, resistor R25, resistor R26, resistor R27, resistor R29, resistor R31, resistor R32, resistor R36, NPN transistor Q1 and NPN transistor Q2, wherein a first end of the capacitor C21, a first end of the capacitor C22 and a first output end of the sound control component MC are connected to the ground; a second end of the capacitor C21, a first end of the resistor R21 and a first end of the resistor R25 are connected to a first end of the resistor R31 and a first end of the resistor R26; a second end of the resistor R26 is connected to the power supply VDD; a second end of the capacitor C22 and a first end of the resistor R22 are connected to a second end of the resistor R21; a second end of the resistor R22 and a first end of the resistor R20 are connected to a second output end of the sound control component MC; a second end of the resistor R20 is connected to a first end of the capacitor C20; a second end of the capacitor C20, a first end of the capacitor C23 and a first end of the resistor R23 are connected to a first end of the resistor R32 and the base of the NPN transistor Q1; a second end of the capacitor C23, a second end of the resistor R23 and a second resistor R25 are connected to a first end of the resistor R27 and the collector of the NPN transistor Q1; a second end of the resistor R27 is connected to a first end of the capacitor C27; a second end of the capacitor C27, a first end of the capacitor C29 and a first end of the resistor R29 are connected to a first end of the resistor R36 and the base of the NPN transistor Q2; a second end of the resistor R31 and a second end of the capacitor C29 are connected to a second end of the R29 and the collector of the NPN transistor Q2; and the emitter of the NPN transistor Q1, the emitter of the NPN transistor Q2 and a second end of the resistor R36 are connected to the ground.

* * * * *